(12) United States Patent
Amit et al.

(10) Patent No.: US 9,595,949 B2
(45) Date of Patent: Mar. 14, 2017

(54) CONTROL OF A CLAMP CIRCUIT DURING TRANSIENT CONDITIONS

(71) Applicant: NEC ENERGY SOLUTIONS, INC., Westborough, MA (US)

(72) Inventors: Ron Amit, Newton, MA (US); Gregory W. Tremelling, Berlin, MA (US); Oleg Kerbel, Needham, MA (US); Yevgeny Maltsev, Hudson, MA (US)

(73) Assignee: NEC Energy Solutions, Inc., Westborough, MA (US)

( * ) Notice: Subject to any disclaimer, the term of this patent is extended or adjusted under 35 U.S.C. 154(b) by 0 days.

(21) Appl. No.: 14/722,234

(22) Filed: May 27, 2015

(65) Prior Publication Data
US 2016/0352318 A1 Dec. 1, 2016

(51) Int. Cl.
*H02M 3/335* (2006.01)
*H03K 17/0814* (2006.01)
*H02H 9/04* (2006.01)
*H02M 7/06* (2006.01)
*H03K 5/08* (2006.01)

(52) U.S. Cl.
CPC ........ *H03K 17/0814* (2013.01); *H02H 9/042* (2013.01); *H02M 7/06* (2013.01); *H03K 5/08* (2013.01)

(58) Field of Classification Search
CPC ....... H02H 3/20; H02H 9/042; H03K 17/0814
USPC .... 361/91.5, 58, 91.7; 363/20, 56.01, 56.07, 363/56.08; 327/309, 306
See application file for complete search history.

(56) References Cited

U.S. PATENT DOCUMENTS

| 8,155,898 B2* | 4/2012 | Krein | H02M 1/15 702/182 |
| 2003/0039128 A1* | 2/2003 | Cohen | H02M 3/158 363/20 |
| 2014/0126098 A1* | 5/2014 | Sarrus | H02H 3/20 361/91.5 |

* cited by examiner

*Primary Examiner* — Dinh T Le
(74) *Attorney, Agent, or Firm* — Chapin IP Law, LLC (57) ABSTRACT

According to example configurations herein, a clamp circuit includes: i) a power dissipation circuit disposed between a first node and a second node of the clamp circuit, and ii) a capacitive element disposed in a control path between the first node and a control input of the power dissipation circuit. During operation, when a voltage spike occurs at the first node, such as caused by opening of a respective switch, the capacitive element in the control path conveys a portion of energy from the first node to control activation of the power dissipation circuit. That is, during the voltage spike, based on conveyance of the energy over the control path, the power dissipation circuit turns ON to dissipate the transient voltage, protecting a main power switch.

13 Claims, 13 Drawing Sheets

CONTROL OF A CLAMP CIRCUIT DURING TRANSIENT CONDITIONS

BACKGROUND

When a high power switch (such as a field effect transistor) opens under load, it is common to see a high magnitude, high rate-of-change voltage across the power switch immediately following the opening of the high-power switch. Unfortunately, such a transient condition can cause damage to the power switch, and/or to other peripheral circuits, either nearby, or directly or indirectly connected to the power switch.

The main cause of the switching transient is the potential for some finite, unpredictable amount of inductance, (L), in series with the power circuit being interrupted by opening of the switch. The energy built up in such inductance based on current flowing through it, causes that current to continue to flow through or around the power switch even after it has been opened. Eventually, the flow of energy from the inductive element is dissipated such as via an arc, or in a connected snubbing circuit, or by the main power switch itself, which could potentially cause catastrophic component damage.

BRIEF DESCRIPTION

Figure 1:
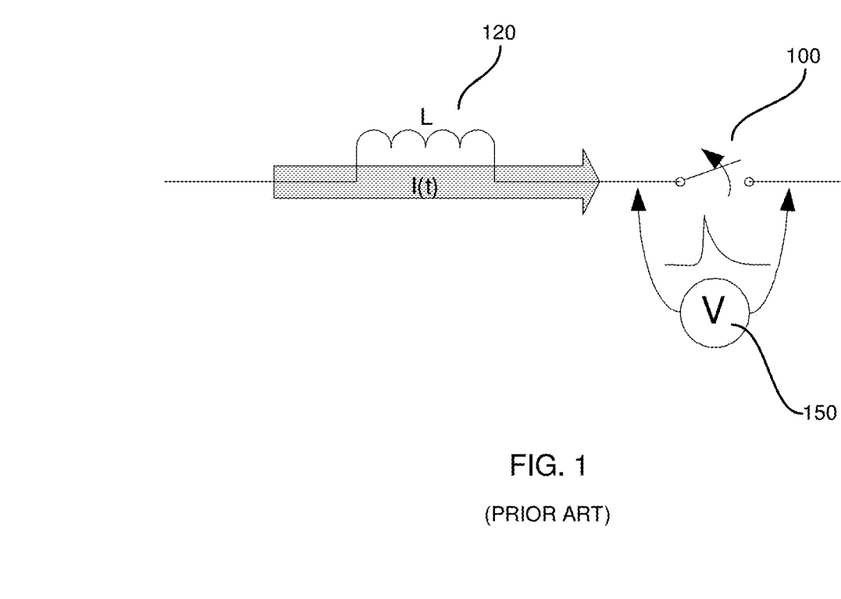
FIG. 1 is an example diagram illustrating conveyance of current through an inductive path and switching circuit according to the prior art.

As shown in FIG. 1, the current I(t) through inductive element 120 drives up the voltage to oppose the opening of the switch, thus forming the switching transient voltage 150 across nodes of the switch 100.

There are several solutions to so-called snubbing voltage across a power switch to avoid damage to such switching circuitry. For example, one conventional method of absorbing the transient voltage is to cause another component to absorb the energy released by the inductor.

Figure 2:
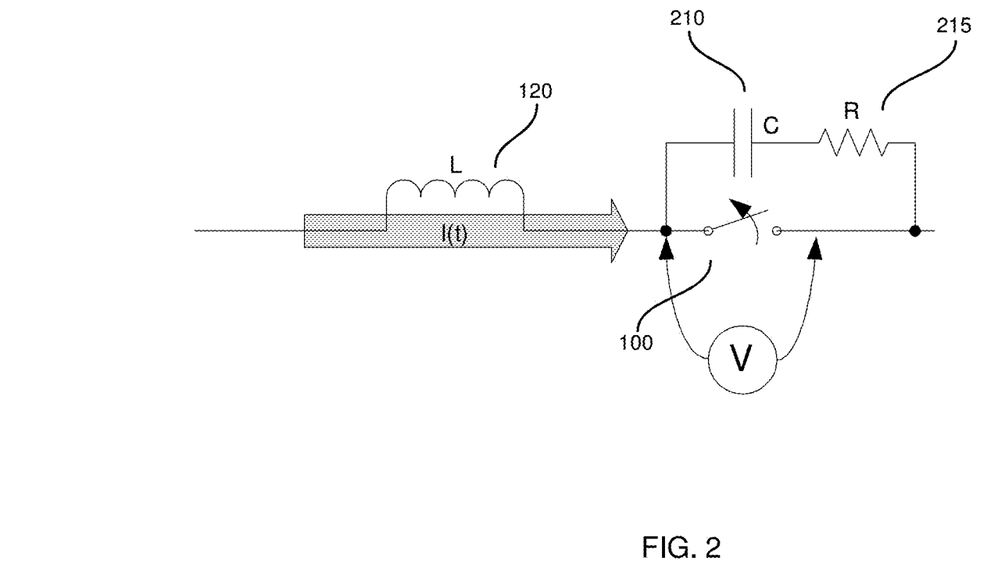
FIG. 2 is an example diagram illustrating use of a conventional RC clamp circuit to protect a power switch according to embodiments herein.

As shown in FIG. 2, a capacitor 210 can be configured to absorb some of the transient energy as discussed above. If a capacitor 210 is placed across the switch 100, the energy of the inductor element 120 is transferred to the capacitor 210. However, those skilled in the art of electric circuits, know that the resulting circuit in FIG. 2 would resonate at a frequency determined by the inductance of inductor element 120 and capacitor 210. In such an instance, the transient energy would simply transfer back and forth between the capacitor 210 and the inductive element 120, resulting in undesirable oscillations.

Another method to absorb the transient condition is to use a resistor 215 in conjunction with a capacitor 210. In such an instance, the resistor 215 can dissipate the energy being transferred between the inductive element 120 and the capacitor 210. The resistor 215 can be chosen such that it dissipates the energy in the shortest amount of time for given set of conditions and circuit values. However, if the resistance, R is too high, the voltage transient will be high since it will be proportional to the initial inductor current and the resistance value. If the resistance is too low, the capacitor 210 and inductive element 120 will transfer energy between each other in an oscillatory manner until eventually the energy is dissipated by the small resistor 215. The disadvantage of this method is that the R and C values can be optimized for one set of conditions, in particular the inductance. A fully damped circuit requires the R and C values to be set according to the expected inductance. However, in many cases, the value of the inductance element 120 is not known, and is the result of varying wire-lengths, and even orientations in an external circuit. Therefore, if one capacitor 210 is chosen for the design, it will be effective at reducing the transient let-through voltage for only a narrow range of inductance, and not effective for any other inductance values.

Figure 3:
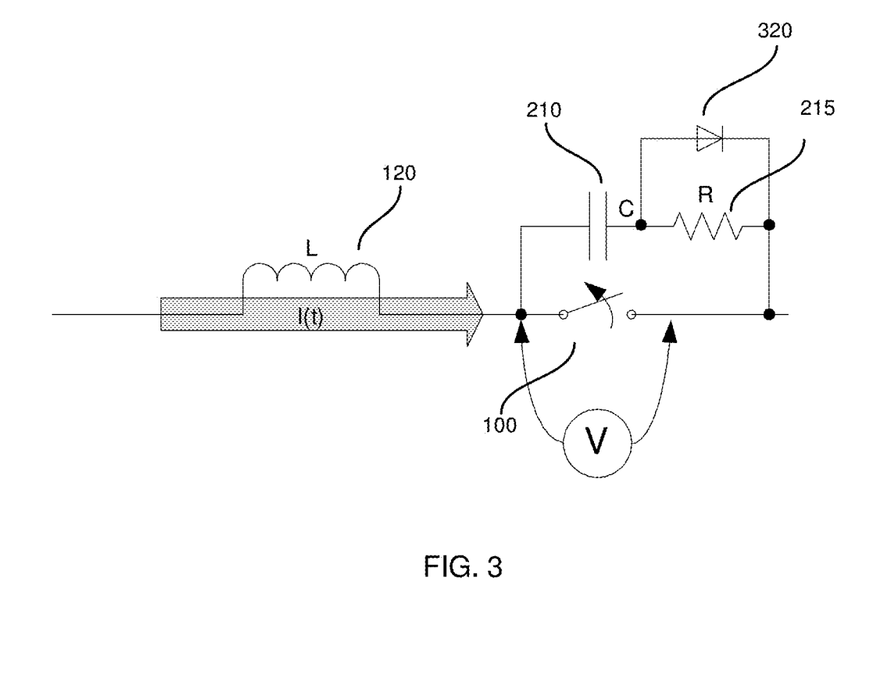
FIG. 3 is an example diagram illustrating use of a conventional RCD snubber to protect a power switch according to embodiments herein.

In accordance with FIG. 3, a third method is to include a diode 320 across the resistor 215 such that the forward current flowing through the inductive element 120 goes directly to charge the capacitor 210 as quick as possible. This keeps the voltage transient down, while still achieving a critically damped filter. In such an instance, the energy from the inductive element 120 transfers quickly and smoothly to the capacitor 210. The capacitor's voltage rises to a level proportional to the square-root of the energy transferred from the inductive element 120. However, this voltage stays on the capacitor 210 until the main power switch 100 is closed again, at which point, the energy from the capacitor 210 is dissipated through the resistor 215 in the form of heat. This condition and process may be non-ideal for some applications.

Figure 4:
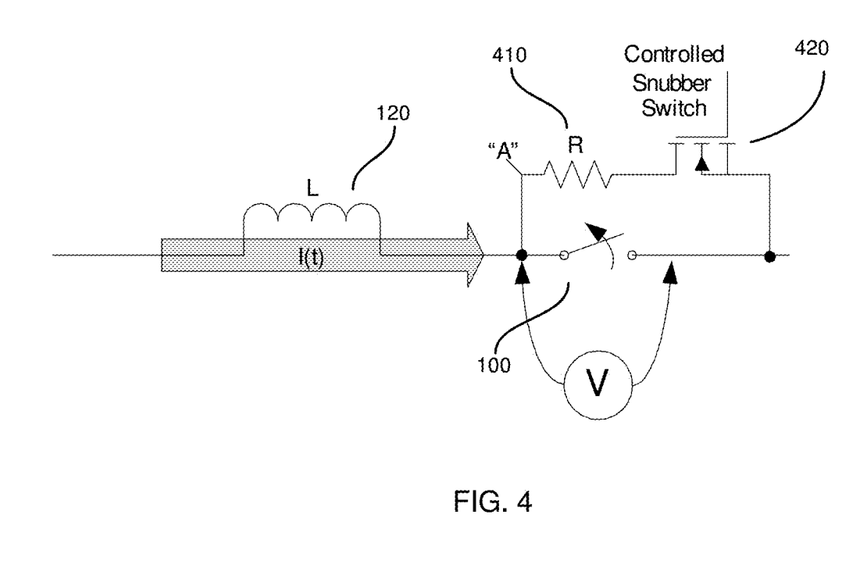
FIG. 4 is an example diagram illustrating use of an active component clamp circuit to protect a power switch according to embodiments herein.

As further shown in FIG. 4, a fourth method, a resistor 410 and a controlled clamp switch 420 is configured to absorb the energy stored in the inductive element 120 when the corresponding main power switch 100 is opened. When the energy is fully dissipated, the clamp circuit including the resistor 410 and the clamp switch 420 turns off and allows the main power switch to be fully open.

One device that could serve as a clamp switch is a MOSFET (Metal Oxide Semiconductor Field Effect Transistor).

Figure 5:
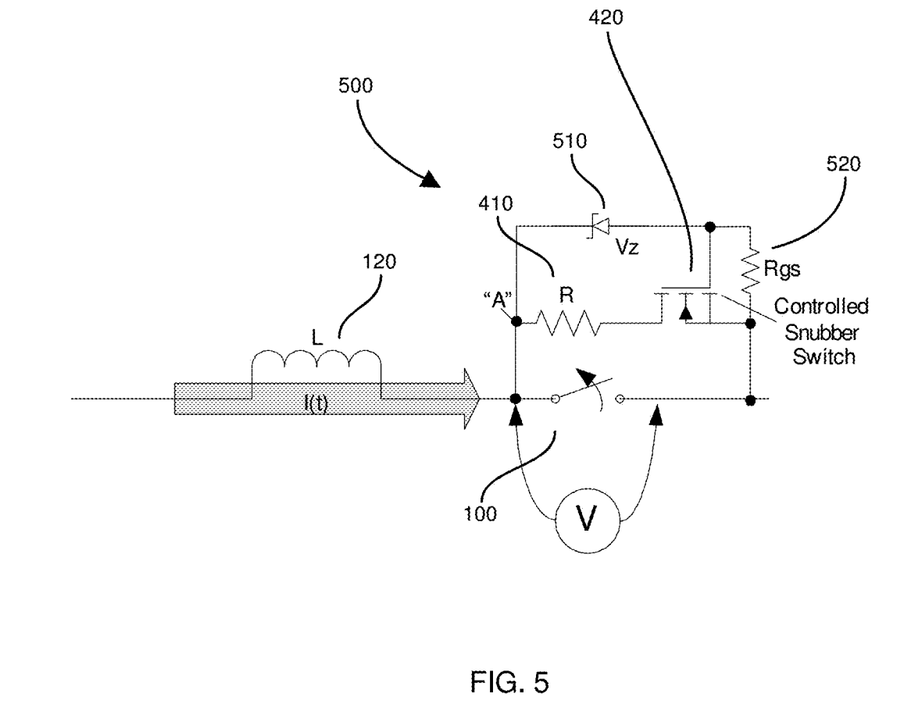
FIG. 5 is an example diagram illustrating use of an active switch controlled by Zener diode clamp circuit to protect a power switch according to embodiments herein.

As shown in FIG. 5, one simple way to control the clamp switch is to connect a voltage dependent element (such as a Zener diode 510, having a breakdown voltage of Vz) from point "A" on the diagram to the gate of the controlled switch 420 (controlled clamp MOSFET). When the voltage across the main power switch 100 exceeds the voltage rating, Vz, of the Zener diode 510, the clamp transistor 420 is turned on, allowing current to flow through the resistor 410, R, until the voltage across the main power switch 100 falls below the breakdown voltage rating of the Zener diode 510. In the case of a switching transient event, this occurs when the inductor's energy is too low to continue to push current into the clamp circuit.

A problem with this approach is that it is difficult to coordinate the threshold voltage of the voltage clamp switch 420 with the breakdown voltage of the main power switch 100. For example, it may be desirable to cause the voltage clamp switch 420 to be activated before the voltage on the main power switch 100 exceeds its breakdown voltage (i.e. the voltage at which the main power switch 100 could be damaged). If that is the case, the clamp switch 420 must be turned on at a voltage that is marginally lower than a breakdown voltage of the main power switch 100. However, if a threshold voltage of the clamp circuit is too low, then the circuit consisting of the main power switch 100 coupled with the controlled clamp switch 420 will not be able to hold off a DC voltage that is as high as the rating of the main power switch 100. Furthermore, if the voltage dependent element (Zener diode 510) leaks current, the clamp circuit may by-pass too much current around the main power switch.

Figure 6:
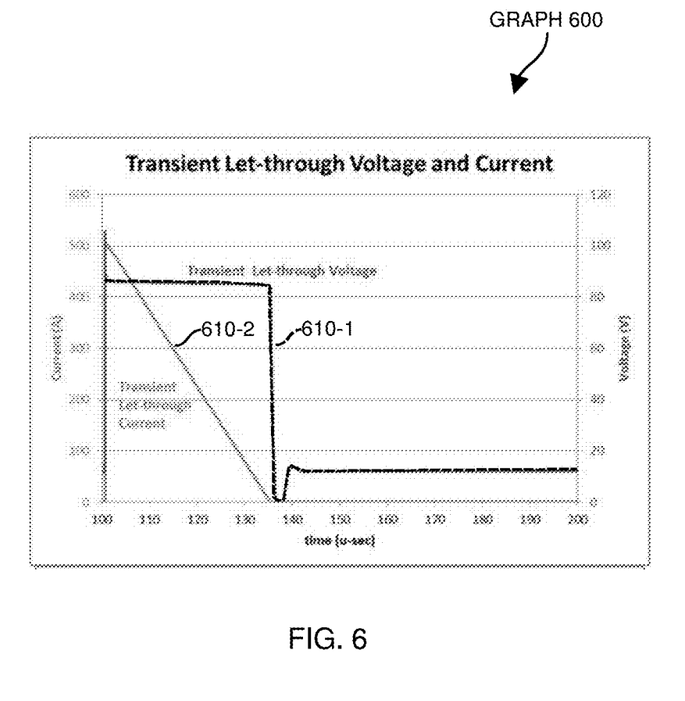
FIG. 6 is an example graph illustrating let-through voltage and let-through current based on the circuit in FIG. 5.

FIG. 6 is an example graph illustrating so-called let-through current and let-through voltage according to embodiments herein.

As shown in graph 600, voltage signal 610-1 represents a magnitude of voltage over time applied across the clamp circuit. The voltage is seen by the gate node of switch 420 via the Zener diode 510, upon opening of main power switch 100. In general, the let through voltage is the portion of the transient voltage that is conveyed to the gate node of switch 420 upon opening of the main power switch 100. Current signal 610-2 represents a magnitude of let-through current over time absorbed by the clamp circuit in FIG. 5 upon opening of main power switch 100.

Figure 7:
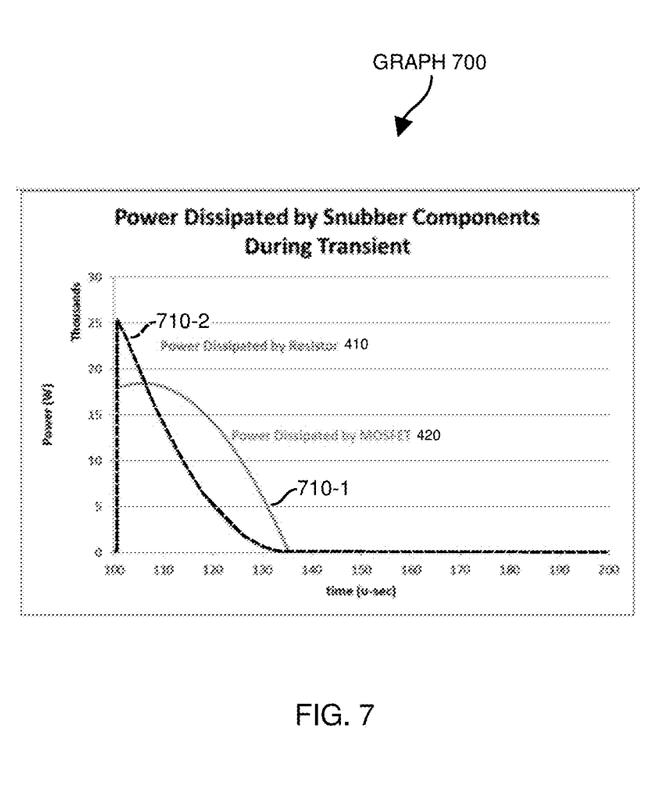
FIG. 7 is an example graph illustrating dissipation of transient power in different components of the clamp circuit in FIG. 5.

FIG. 7 is a graph illustrating dissipation of transient power in the dissipative components of the clamp circuit according to embodiments herein. In this example, the area under each of the curves (such as curves 710-1 and curve 710-2) represent the amount of power dissipated by each of the resistor 410 and switch 420 in FIG. 5 when the switch 100 is set to an open state after current flows through inductor 120. The area under curve 710-1 represents amount of power dissipated by the transistor 420. The area under curve 710-2 represents the power dissipated by the resistor 410. Clearly, in this example, the transistor switch 420 dissipates more power during a respective transient than the resistor 410 (larger area under the curves).

In contrast to prior art and the above-mentioned embodiments, additional embodiments herein include an improved clamp circuit.

For example, in one embodiment, the clamp circuit includes: i) a first node "A", ii) second node "B", iii) a power dissipation circuit disposed between the first node and second node, and iv) a capacitive element disposed in a control path between the first node and a control input of the power dissipation circuit. When a voltage spike occurs at the first node such as due to opening of a switch, the capacitive elements in the control path conveys energy from the first node to control activation of the power dissipation circuit. For example, during the voltage spike, based on conveyance of the energy over the control path including a capacitive element, the power dissipation circuit turns ON to dissipate the transient voltage.

In one embodiment, the improved clamp circuit as described herein protects a main power switch. For example, in one embodiment, a first node of the clamp circuit "A" is electrically coupled to a first node of the main power switch; a second node of the clamp circuit "B" is electrically coupled to a second node of the main power switch. Selective activation of the main power switch switches between providing a high impedance and low impedance path between the first node and the second node.

As a further example embodiment, when the main power switch is activated to an ON state, the main power switch provides a low impedance path (short-circuit) between the first node and the second node of the clamp circuit. At such time, the clamp circuit is deactivated.

Conversely, when the main power switch is deactivated to an OFF state, the main power switch provides a high impedance path (open-circuit) between the first node "A" and the second node "B" of the clamp circuit. At such time, the clamp circuit is activated to dissipate any excess energy that can damage the main power switch. That is, the main power switch can be disposed in an inductive path. Upon opening of the main power switch, the excess energy in the inductive path gets absorbed by the clamp circuit.

As further discussed herein, use of the capacitive element such as voltage coupling capacitor to control application of spike energy (due to opening of the main power switch) to a power dissipation circuit provides a beneficial way of controlling the power dissipation circuit. For example, the power dissipation circuit can include a resistor and corresponding transistor disposed in series between the first and second node. In accordance with one embodiment, the inclusion of the capacitive element in the control path of the power dissipation circuit enables control of the power dissipation circuit such that a larger proportion is dissipated by the resistor element than that dissipated by the clamp circuit transistor switch (420) upon opening of a main power switch disposed between the first node "A" and the second node "B".

Thus, by adding another component such as a capacitor to a voltage snubber circuit, a respective switch in the power dissipation circuit can be controlled to at least initially turn ON (operate in saturation mode) in response to a high rate of voltage (dv/dt) across the main power switch, instead of at a fixed threshold voltage. As a result, the clamp circuit transistor switch such as a MOSFET will be activated at lower transient voltages across the main power switch; while higher DC voltages can be maintained across the main power switch on a continuous basis. Note that values of the clamp circuit's components can be selected to achieve an optimal response to expected ranges of inductance and interruption current.

These and other more specific embodiments are disclosed in more detail below.

The embodiments as described herein are advantageous over prior art techniques. For example, the embodiments as discussed herein can be used to desirably control a distribution of power dissipation amongst multiple components in a clamp circuit. For example, as previously discussed, the clamp circuit can include a combination of a resistor and a controlled clamp switch. In accordance with one embodiment, the clamp circuit can be designed such that more transient energy (as compared to prior art techniques) is dissipated in the resistor than the switch, since it is beneficial to make resistors that can absorb more surge energy than it is to make active switches (such as Silcon-based switches) that can absorb such energy. Typically, it is also desirable to control operation of the clamp switch such that it does not leak current around the main power switch while the main power switch is off.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

As previously discussed, a clamp circuit includes a power dissipation circuit disposed between a first node "A" and a second node "B" of a power switch. The clamp circuit includes a capacitive element disposed in a control path between the first node and a control input of the power dissipation circuit. During operation, when a voltage spike occurs at the first node "A", such as caused by opening of the power switch, the capacitive element in the control path conveys a portion of energy from the first node to control activation of the power dissipation circuit. For example, during the voltage spike, based on conveyance of the energy over the control path, the power dissipation circuit turns ON to dissipate the transient voltage (to clamp the voltage), protecting the main power switch from damage. In one embodiment, inclusion of the capacitor element in the clamp circuit ensures that a resistor in the power dissipation circuit dissipates more of the voltage spike (transient energy) than a transistor in the power dissipation circuit.

Figure 8:
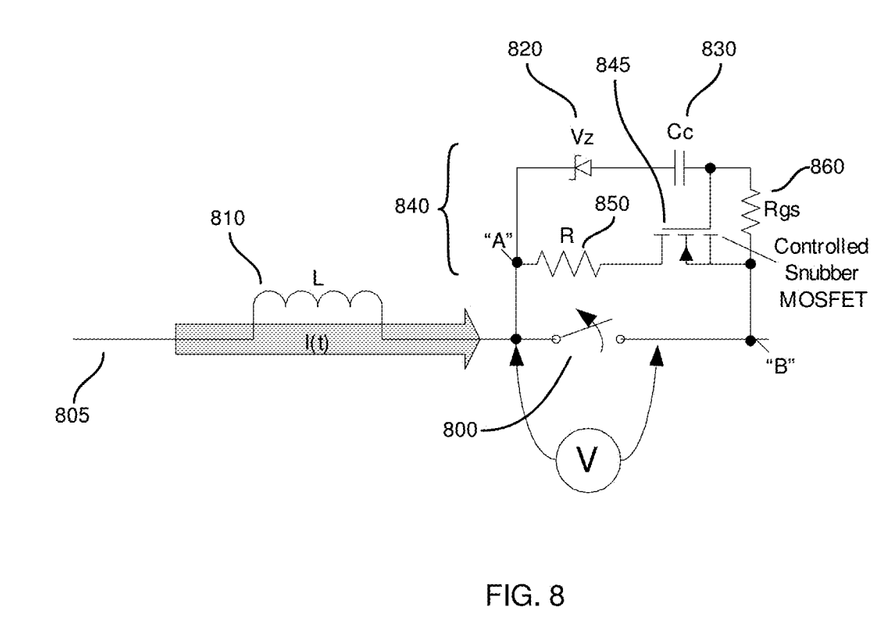
FIG. 8 is an example diagram illustrating a novel clamp circuit according to embodiments herein.

FIG. 8 is an example diagram illustrating a clamp circuit according to embodiments herein.

As shown, the clamp circuit 840 according to embodiments herein provides protection to main power switch 800. For example, the clamp circuit 840 includes a series combination of resistor 850 and switch 845 (i.e., such as a transistor switch) between node "A" and node "B" of the main power switch 800. Additionally, the clamp circuit 840 includes a series combination of Zener diode 820 (a voltage-dependent current limiting circuit element) and capacitor 830 disposed between node "B" and the gate node of switch 845. Resistor 860 provides discharge path of the charge on the gate node of switch 845 to node "B."

Note that any suitable component values can be chosen for the components in the clamp circuit 840 depending upon the application.

For example, in one embodiment, the reverse breakdown threshold voltage associated with the Zener diode can be chosen to be about one third of the breakdown voltage of the main power switch. By way of non-limiting example embodiment, the reverse breakdown threshold voltage associated with the Zener diode 820 can be 33V.

By further way of non-limiting example, capacitor 830 can be the substantially same or similar value as the parasitic gate-source capacitance of the clamp MOSFET (such as 47 nanoFarads).

By way of non-limiting example, resistor 860 (Rgs) can be selected as a 1 kilo ohm resistor.

By way of non-limiting example, resistor 850 can be selected as a 100 milliohm resistor.

For further the sake of illustration, the inductance value, L, associated with the circuit path 805 can be 5 uH (micro-Henries); the interrupting current I(t) can be 500 ADC, and the driving voltage behind the inductive element 810 in circuit path 805 can be 12V or some other suitable value.

During operation, when the main power switch 800 is opened, as a result of the load current through inductive element 810 in circuit path 805, a high dv/dt voltage can be observed at point "A" with respect to point "B" (across the main power switch 800). When this transient voltage exceeds the reverse breakdown voltage threshold value (Vz) associated with Zener diode 820, current flows through the Zener diode 820 and capacitor 830 (labeled Cc) into the parasitic gate capacitor of the switch 845 (clamp MOSFET). In this instance, because of the high dv/dt (change in voltage over time) at node "A", switch 845 almost instantly transitions to an ON state. In contrast to the circuits in the prior art, a combination of the capacitor 830 and the Zener diode 820 initiate earlier (at lower voltage) control of the gate node of the switch 845 from node "A", which ultimately leads to a lower voltage between nodes and "A" and "B".

In one embodiment, the circuit path including Zener diode 820 and corresponding capacitor 830 passes a portion of transient voltage at the node "A" to the control input (gate node) of switch 845 in the power dissipation circuit, which includes the series connection of resistor 850 and switch 845.

The current such as 500 A (Amperes) that was flowing through the main power switch 800 (while the switch 800 was ON) is now diverted to the power dissipation circuit including resistor 850 and switch 845 connected in series between node "A" and node "B." The resistor 860 (Rgs) will start to drain the charge off the gate of switch 845, having the effect of partially turning OFF the switch 845. At such time, the voltage between nodes "A" and "B" starts to rise, but it only rises at a rate which drives enough current through capacitor 830 (Cc) and into resistor 860 (Rgs) to keep the switch 845 ON enough to carry and/or dissipate the remaining current, I(t), from the inductive element 810. Thus, activation of the switch 845 provides a respective path through a combination of resistor 850 and switch 845 switch 845 from node "A" to node "B".

Note that it is possible to adjust the values of capacitor 830, resistor 860, Zener diode 820, and resistor 850 to obtain an optimal balance of dissipation of power in the resistor 850, R, and the snubbing MOSFET for a given set of operating conditions and desired performance. In one embodiment, adjusting the values of Zener diode 820

(breakdown voltage) and resistor 850 will affect how large the initial transient voltage is (Clamp voltage). Adjusting the values of capacitor 830 and resistor 860 will adjust how long the clamp circuit 840 would be active.

One advantage of the clamp circuit 840 is that the transient let-through voltage across the main power switch 800 is of a smaller magnitude during rapid switching OFF events, since the value of the reverse breakdown voltage Vz (associated with the Zener diode 820) can be much lower than the breakdown rating of the main power switch 800. In one embodiment, the reverse breakdown voltage value Vz associated with Zener diode 510 in FIG. 5 is set to be near or marginally lower than the breakdown voltage of the main power switch 100. According to embodiments herein, in FIG. 8, the reverse breakdown voltage value Vz associated with the Zener diode 820 can be considerably lower, as low as the source voltage (for example, 12V), and successfully protect the main power switch 800.

As previously discussed, another advantage associated with clamp circuit 840 is that since the transient let-through voltage is of a lesser value, the amount of power dissipated by the resistor 850 is larger than that dissipated by the switch 845 for the same set of input conditions of interrupted current, inductance, and dissipating resistance, R. Therefore, a smaller, lower current-rated snubbing MOSFET (switch 845) can be used to absorb the same amount of inductive energy conveyed by inductor element 810 in circuit path 805 Vs in FIG. 5.

Lastly, the proposed components allow greater flexibility in the circuit design to adjust for expected operating conditions and performance results.

As previously discussed in FIG. 6, with a high-value reverse breakdown voltage threshold associated with Vz (Zener diode 510), the voltage between "A" and "B" in the clamp circuit 500 of FIG. 5 rises to the level of approximately Vz-85V, and stays there until the current provided through the inductor element 120, L is dissipated.

Figure 9:
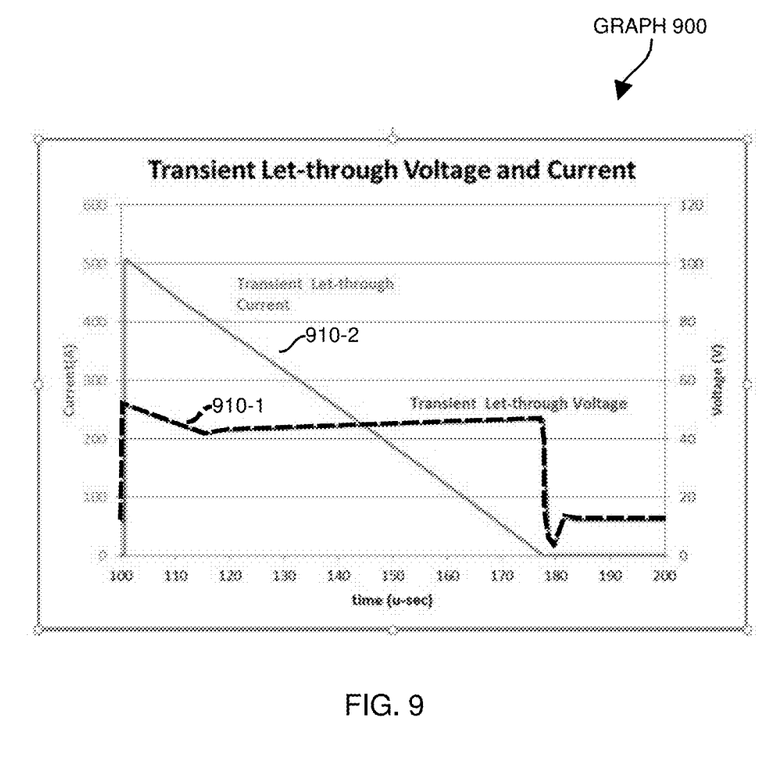
FIG. 9 is an example graph illustrating let-through current and let-through current associated with the novel clamp circuit according to embodiments herein.
Figure 10:
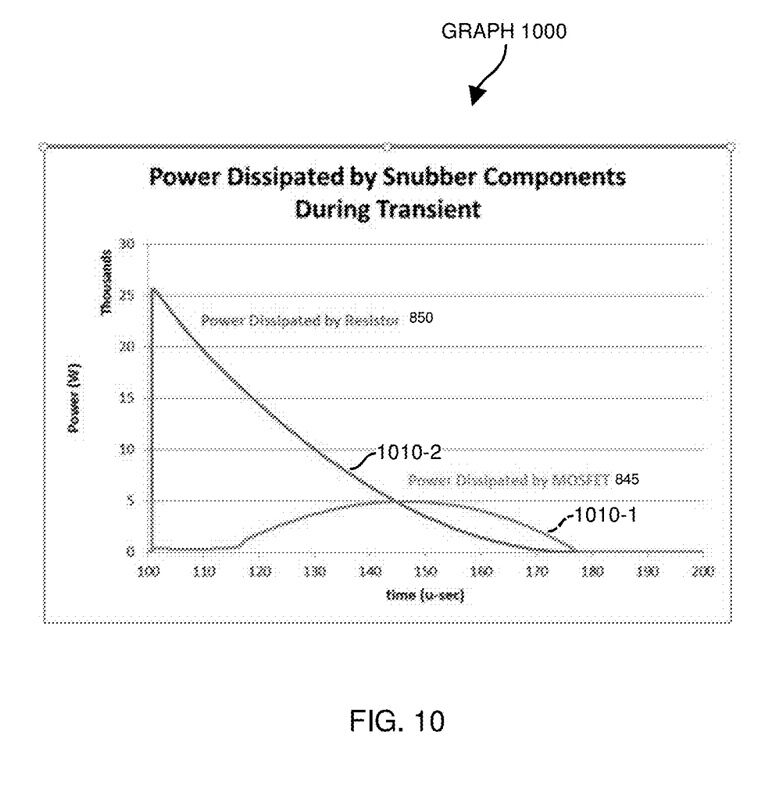
FIG. 10 is an example graph illustrating dissipation of transient power in different components of a clamp circuit according to embodiments herein.

In contrast, as shown in FIGS. 9 and 10 associated with the clamp circuit 840 of FIG. 8, the so-called transient let-through voltage across the power switch 800 increases. When clamp circuit 840 includes a Zener diode 820 having a reverse breakdown voltage of approximately 35 V, the let-through voltage conveyed through the Zener diode 820 and the capacitor 830 as applied to the gate of switch 845 is approximately 50 V as shown by signal 910-1 in graph 900 of FIG. 9. In such an instance, as shown by signal 910-2, the current absorbed by the clamp circuit 840 is initially 500 A at time equal to approximately 100 μs and dissipates to about 0 A at a time of around 178 μs.

As shown in the corresponding graph 1000 in FIG. 10, the amount of energy dissipated by the resistor 850 is less than the amount of energy that is dissipated by the switch 845. For example, the area under the curve 1010-1 in graph 1000 represents the amount of energy dissipated by the switch 845. The area under the curve 1010-2 in graph 1000 represents the amount of energy dissipated by the resistor 850. Thus, as shown by graph 1000, inclusion of the capacitor 830 in the clamp circuit 840 according to embodiments herein ensures that the power or energy dissipated by the resistor 850 is substantially more than an amount of power or energy dissipated by the switch 845.

In one embodiment, as previously discussed, the clamp circuit 840 includes a power dissipation circuit such as a combination of resistor 850 and switch 845 disposed between nodes "A" and "B." The capacitive element controls the energy applied to the switch 845 (clamp switch) to maximize the energy dissipated by the resistor element 850 upon opening of a main power switch 800. Power dissipation circuit (combination of resistor 850 and switch 845) is disposed between node "A" and node "B."

Figure 11:
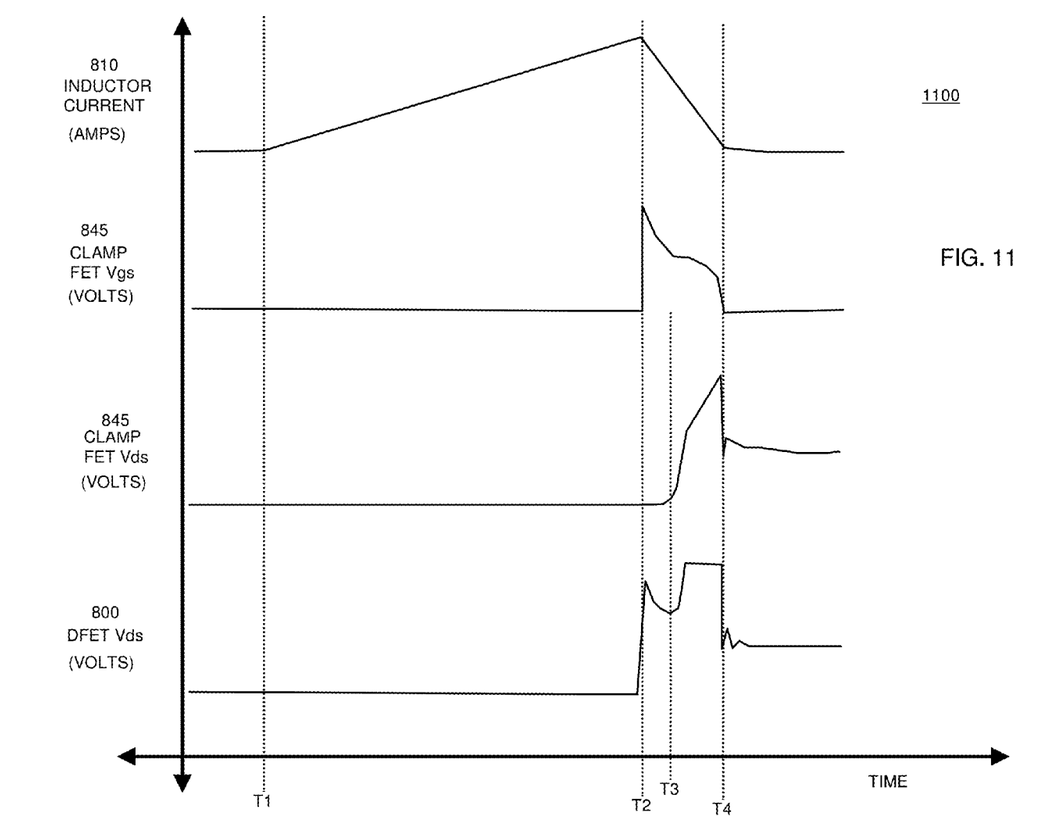
FIG. 11 is an example timing diagram illustrating operation of a clamp circuit according to embodiments herein.

FIG. 11 is an example timing diagram illustrating operation of the clamp circuit in FIG. 8 according to embodiments herein.

As shown in timing diagram 1100, at time T1, a controller resource activates main power switch 800 to an ON state. This causes the inductor current through circuit path 805 to ramp up (such as to 500 Amps) over time. Assume that, at time T2, a monitor resource detects an overcurrent condition. In response to detecting the overcurrent condition at time, T2, a controller resource deactivates main power switch 800.

In response to setting the main power switch 800 to an OFF state, the voltage at node of the clamp circuit 840 spikes in a manner as previously discussed. This causes the clamp FET voltage Vgs associated with switch 845 to spike based on passing of the current from node "A" through Zener diode 820 and capacitor 830 to the gate node of switch 845. In such an instance, the switch 845 operates in a saturated mode between time T2 and T3.

By time T3, the resistor 860 discharges a portion of the transient energy conveyed to the gate of MOSFET 845. As shown in the timing diagram 1100, between time T3 and T4, the switch 845 operates in a linear mode instead of a saturated mode. In such an instance, between time T3 and T4, the switch 845 dissipates a larger portion of the residual transient energy from inductive element 810 as compared to dissipation of energy between time T2 and T3.

Accordingly, at or around a time (T2) of opening the main power switch 800, a combination of the Zener diode 820 and the capacitor 830 convey the transient energy at the instance of the opening the main power switch 800. The voltage spike initially causes the switch 845 to operate in a saturated mode for a first portion (between time T2 and time T3) of a power dissipation event follow the opening the main power switch 800. Thereafter, the Zener diode 820 and the capacitor 830 continue to convey the second portion (between time T3 and time T4) of the transient energy to the gate of the switch 845, causing the switch 845 to operate in a controlled linear mode for the second portion of the power dissipation event since opening the main power switch 800.

Figure 12:
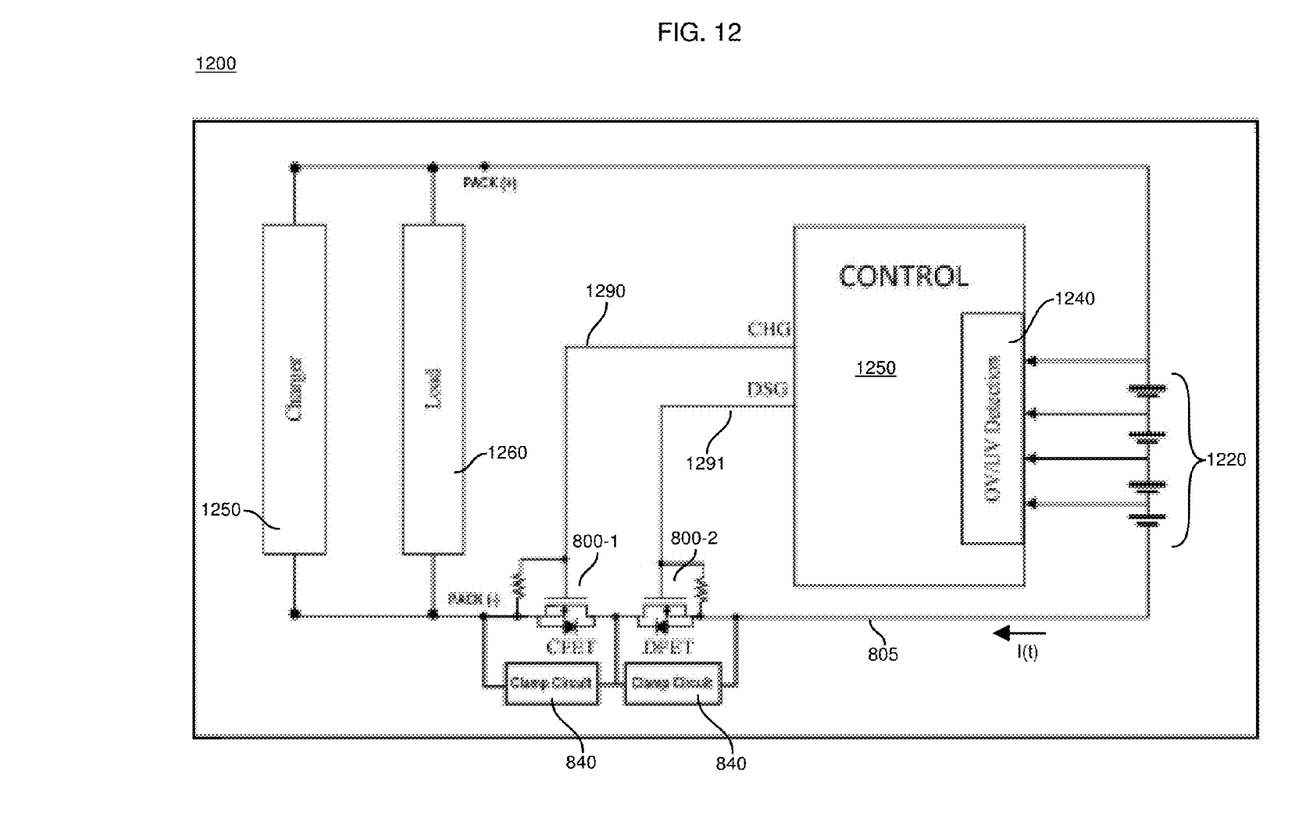
FIG. 12 is an example diagram illustrating an environment including one or more clamp circuits according to embodiments herein.

FIG. 12 is an example diagram illustrating an environment including one or more clamp circuits according to embodiments herein.

As shown, system 1200 includes charger 1250, load 1260, power switch 800-1, power switch 800-2, clamp circuits 840, control resource 1250, monitor circuit 1240, and power resources 1220 (such as one or more batteries or other type of energy storage resources).

During operation, power sources 1220 supply current to power load 1260. Charger 1250 can be configured to charge power resources 1220 as well as provide power to load 1260. Monitor circuit 1240 monitors the one or more power sources 1220 and controls a respective state of power switch 800-1 and power switch 800-2.

Normally, power switch 800-1 and power switch 800-2 are set to ON states. Monitor circuit 1240 monitors a magnitude of current and/or voltage associated with power sources 1220. In response to detecting an overvoltage or overcurrent condition indicating that charger 1250 is about to cause damage to power sources 1220 or other resource, the control resource 1250 produces control signal 1290 to turn OFF the main power switch 800-1. Setting the switch 800-1 to the OFF state, protects the power sources 1220 from being damaged by charger 1250 because current from the charger 1250 is no longer able to charge the power sources 1220. In such an instance, when the main power switch 800-1 is initially turned off, the clamp circuit 840 operates in a manner as previously discussed to prevent current passing through circuit path 805 from damaging the main power switch 800-1.

In a similar manner, the power sources 1220 can be configured to provide power to load 1260. In response to detecting a condition such as load 1260 drawing too much current from power sources 1220, the control resource 1250 generates control signal 1291 to transition the main power switch 800-2 to an OFF state. In such an instance, when the main power switch 800-2 is initially turned OFF, the corresponding clamp circuit 840 associated with main power switch 800-2 operates in a manner as previously discussed to prevent current passing through circuit path 805 from damaging the main power switch 800-2.

Figure 13:
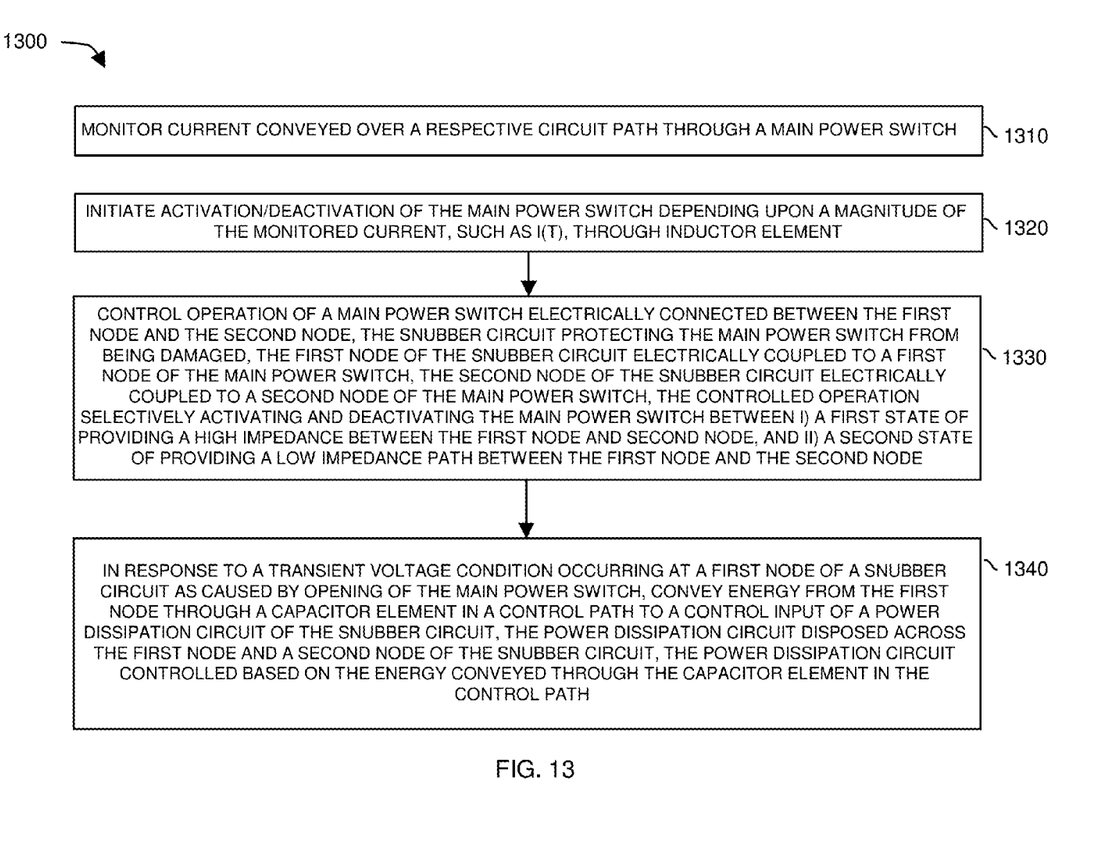
FIG. 13 is an example diagram of a method according to embodiments herein.

FIG. 13 is a flowchart 1300 illustrating an example method according to embodiments herein. Note that there will be some overlap with respect to concepts as discussed above. Also, note that processing can be executed in any suitable order.

In processing block 1310, the monitor resource 1240 monitors current conveyed over a respective circuit path 805 through the main power switch 800.

In processing block 1320, the monitor resource 1240 initiates activation/deactivation of the main power switch 800 depending upon a magnitude of the monitored current, such as I(t), through inductor element 810.

In processing block 1330, the control resource 1250 controls operation of main power switch 840-1, which is electrically connected between a first node (node "A") and a second node (node "B"). The clamp circuit (clamp circuit 840) protects the main power switch 840 from being damaged. For example, the first node "A" of the clamp circuit 840 is electrically coupled to a first node of the main power switch 800. The second node "B" of the clamp circuit 840 is electrically coupled to a second node of the main power switch 800. The control resource 1250 selectively activates and deactivates the main power switch 800 between i) a first state of providing a high impedance between node "A" and node "B" of clamp circuit 840, and ii) a second state of providing a low impedance path between node "A" and node "B" of the clamp circuit 840.

In processing block 1340, in response to a transient voltage condition occurring at node "A" of a clamp circuit 840 as caused by opening of the main power switch 800, the clamp circuit 840 conveys energy of the inductive element 810 in circuit path 805 from the first node "A" through a capacitor element 830 in a control path to a control input (such as a gate of switch 845) of the clamp circuit 840. As previously discussed, the power dissipation circuit (such as a combination of the resistor 850 and the switch 845) is disposed across the first node and a second node of the clamp circuit 840. The capacitor element 830 in the control path from node "A" to the gate node of switch 845 conveys transient energy (based upon opening of switch 800) to control the power dissipation circuit comprising resistor 850 and switch 845.

Accordingly, via embodiments herein, a design clamp circuit 840 successfully absorbs the energy from an inductive element 810 immediately after the main power switch 800 is shut off. Use of the novel clamp circuit 840 reduces the voltage level across an opening of power switch 800, preventing damage. Such an embodiment allows increased degrees of freedom to control the balance between the energy that is dissipated by the resistor 850 and switch 845, as well as how long the clamp circuit 840 would be active. This flexibility allows a designer to optimize the cost and maximize the performance results of the clamp circuit 840 for a given set of conditions.

Note again that techniques herein are well suited for protecting switches from damage. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An apparatus comprising:
  a clamp circuit including a first clamp circuit node, a second clamp circuit node, a power dissipation circuit, a voltage-dependent circuit element, a capacitive element, and a discharge capacitor,
  wherein the power dissipation circuit includes a first resistor and a clamp switch, the clamp switch having a control input, the first resistor being serially connected to the clamp switch between the first clamp circuit node and the second clamp circuit node,
  wherein the voltage-dependent circuit element is connected to the first clamp circuit node, the voltage-dependent circuit element having an associated voltage threshold value,
  wherein the capacitive element is connected to the control input, the voltage-dependent circuit element being serially connected to the capacitive element in a control path between the first clamp circuit node and the control input,
  wherein the discharge resistor is connected between the control input and the second clamp circuit node,
  wherein the capacitive element is operative, in response to a transient voltage at the first clamp circuit node exceeding the voltage threshold value, to pass energy from the first clamp circuit node to the control input, thereby causing the clamp switch to operate in a saturation mode from a first time T1 to a second time T2, and
  wherein the discharge resistor is operative to discharge the capacitive element from about the second time T2 to a third time T3, thereby causing the clamp switch to operate in a linear mode from the second time T2 to the third time T3;
  a main over switch including a first power switch node and a second power switch node, the main power switch being disposed in a circuit path between the first power switch node and the second power switch node, the first clamp circuit node being electrically coupled to the first power switch node, the second clamp circuit node being electrically coupled to the second power switch node, the main power switch being operative, upon a selective activation of the main power switch, to switch between providing a high impedance and a low impedance on the circuit path between the first power switch node and the second power switch node; and a detector circuit operative to monitor a current conveyed on the circuit path through the main power switch, and to initiate opening of the main power switch depending upon a magnitude of the monitored current.

2. The apparatus as in claim 1, wherein the voltage-dependent circuit element is a Zener diode.

3. The apparatus as in claim 1, wherein the capacitive element is operative to limit a level of the transient voltage from the first clamp circuit node to the control input in order to control activation of the power dissipation circuit.

4. The apparatus as in claim 1, wherein the capacitive element is further operative to pass the energy from the first clamp circuit node to the control input in order to control a conveyance of current from the first clamp circuit node to the second clamp circuit node.

5. The apparatus as in claim 1, wherein the capacitive element is further operative to pass the energy from the first clamp circuit node to the control input in order to control an amount of the energy applied to the control input of the clamp switch, and wherein, upon opening of the main power switch, each of the first resistor and the clamp switch is operative to dissipate power, the first resistor being operative to dissipate a larger proportion of the power than the clamp switch.

6. The apparatus as in claim 1, wherein the capacitive element is further operative to limit a level of the transient voltage from the first clamp circuit node to the control input of the clamp switch.

7. The apparatus as in claim 1, wherein the clamp switch is a metal oxide semiconductor field effect transistor (MOSFET) switch, wherein the MOSFET switch includes a gate node, a source node, and a drain node, wherein the gate node is the control input, wherein the source node is electrically connected to the second clamp circuit node, wherein the drain node is electrically connected to the first resistor, and wherein the discharge resistor is connected between the gate node of the MOSFET switch and the source node of the MOSFET switch.

8. A method of controlling a clamp circuit during a transient voltage condition, comprising:
providing a clamp circuit including a first clamp circuit node, a second clamp circuit node, a power dissipation circuit, a voltage-dependent circuit element, a capacitive element, and a discharge capacitor, the power dissipation circuit including a first resistor and a clamp switch, the clamp switch having a control input, the first resistor being serially connected to the clamp switch between the first clamp circuit node and the second clamp circuit node, the voltage-dependent circuit element being connected to the first clamp circuit node, the voltage-dependent circuit element having an associated voltage threshold value, the capacitive element being connected to the control input, the voltage-dependent circuit element being serially connected to the capacitive element in a control path between the first clamp circuit node and the control input, and the discharge resistor being connected between the control input and the second clamp circuit node;
in response to a transient voltage at the first clamp circuit node exceeding the voltage threshold value, passing, by the capacitive element, energy from the first clamp circuit node to the control input in order to cause the clamp switch to operate in a saturation mode from a first time T1 to a second time T2;
discharging, by the discharge resistor, the capacitive element from about the second time T2 to a third time T3 in order to cause the clamp switch to operate in a linear mode from the second time T2 to the third time T3;
providing a main power switch including a first power switch node and a second power switch node, the main power switch being disposed in a circuit path between the first power switch node and the second power switch node, the first clamp circuit node being electrically coupled to the first power switch node, the second clamp circuit node being electrically coupled to the second power switch node;
upon a selective activation of the main power switch, switching, by the main power switch, between a first state of providing a high impedance and a second state of providing a low impedance on the circuit path between the first power switch node and the second power switch node;
monitoring a current conveyed on the circuit path through the main power switch; and
initiating opening of the main power switch depending upon a magnitude of the monitored current.

9. The method as in claim 8 further comprising:
limiting, by the capacitive element, a level of voltage from the first clamp circuit node to the control input in order to control activation of the power dissipation circuit.

10. The method as in claim 9 further comprising:
limiting, by the capacitive element, a level of the transient voltage from the first clamp circuit node to the control input of the clamp switch.

11. The method as in claim 8, wherein the clamp switch is a metal oxide semiconductor field effect transistor (MOSFET) switch, wherein the MOSFET switch includes a gate node, a source node, and a drain node, wherein the gate node is the control input, wherein the source node is electrically connected to the second clamp circuit node, wherein the drain node is electrically connected to the first resistor, and wherein the discharge resistor is connected between the gate node of the MOSFET switch and the source node of the MOSFET switch, and wherein the method further comprises:
passing, by the capacitive element, the energy from the first clamp circuit node to the gate node of the MOSFET switch in order to control i) an activation of the MOSFET switch, and ii) a conveyance of current from the first clamp circuit node to the second clamp circuit node through the power dissipation circuit.

12. The method as in claim 8 further comprising:
controlling, by the capacitive element, an amount of the energy applied to the control input of the clamp switch; and
upon opening of the main power switch, dissipating power by each of the first resistor and the clamp circuit, the first resistor dissipating a larger proportion of the power than the clamp switch.

13. The method as in claim 8 further comprising:
limiting, by the capacitive element, a level of the transient voltage from the first clamp circuit node to the control input of the clamp circuit.

* * * * *

UNITED STATES PATENT AND TRADEMARK OFFICE
CERTIFICATE OF CORRECTION

PATENT NO. : 9,595,949 B2  Page 1 of 1
APPLICATION NO. : 14/722234
DATED : March 14, 2017
INVENTOR(S) : Ron Amit et al.

It is certified that error appears in the above-identified patent and that said Letters Patent is hereby corrected as shown below:

In the Claims

Claim 1, Column 10, Line 56, "a main over switch" should read --a main power switch--

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*